(12) United States Patent
Sherlock

(10) Patent No.: US 6,996,068 B1
(45) Date of Patent: Feb. 7, 2006

(54) AUDIO TESTING IN A PACKET SWITCHED NETWORK

(75) Inventor: Stuart W. Sherlock, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/541,046

(22) Filed: Mar. 31, 2000

(51) Int. Cl.
*G01R 31/08* (2006.01)

(52) U.S. Cl. ............. 370/248; 370/251; 370/252; 370/356; 704/228; 704/233

(58) Field of Classification Search ........ 370/241–252, 370/352–356, 468; 704/233, 200; 702/73; 324/76.27
See application file for complete search history.

(56) References Cited

U.S. PATENT DOCUMENTS

| | | | | |
|---|---|---|---|---|
| 5,343,463 A | * | 8/1994 | van Tetering et al. | 370/253 |
| 5,848,384 A | * | 12/1998 | Hollier et al. | 704/231 |
| 6,026,350 A | * | 2/2000 | Tustin et al. | 702/73 |
| 6,275,020 B1 | * | 8/2001 | Nagano | 324/76.27 |
| 6,275,797 B1 | * | 8/2001 | Randic | 704/233 |
| 6,370,120 B1 | * | 4/2002 | Hardy | 370/252 |
| 6,373,855 B1 | * | 4/2002 | Downing et al. | 370/468 |
| 6,675,054 B1 | * | 1/2004 | Ruberg | 700/94 |
| 6,775,240 B1 | * | 8/2004 | Zhang et al. | 370/251 |

OTHER PUBLICATIONS

Thom, *IEEE Communications Magazine*, 1996, 34(12):52-56.

* cited by examiner

*Primary Examiner*—Frank Duong
*Assistant Examiner*—Melanie Jagannathan
(74) *Attorney, Agent, or Firm*—Kacvinsky LLC

(57) ABSTRACT

An audio test system for analyzing and quantifying audio data losses during network-based telephony sessions between communication devices such as telephony-enabled computers and Internet telephones. A transmit device converts an input audio signal to a stream of data packets and communicates the data stream over a network to a receive device. The receive device converts the data stream to an output audio signal. An audio analyzer is coupled to the transmit device and the receive device to monitor and capture the input audio signal and the output audio signal. The audio analyzer determines transmission qualities for the session, such as data loss and latency, by generating and comparing envelope waveforms of the input audio signal and the output audio signal. In order to increase the accuracy of the data loss analysis, the resolution of the envelope waveforms is set as a function of the communication protocol used to communicate the audio data stream and a buffer length of the coder/decoders used by the transmit device and the receive device.

30 Claims, 6 Drawing Sheets

AUDIO TESTING IN A PACKET SWITCHED NETWORK

BACKGROUND

This invention relates to audio testing in a packet switched network.

Audio testing is useful, for example, in Internet telephony, in which telephone-like voice conversations are digitized by personal computers for transmission over the Internet either to other personal computers, where they are reconverted to analog audio, or through an Internet Telephony Service Provider (ITSP) and the public switched telephone network (PSTN) to conventional telephony equipment. Audio quality of Internet telephony is affected by time delays caused during transmission over the Internet, packet loss, data retransmissions, and network jitter.

DESCRIPTION

Conventional communication protocols, such as the H.323 protocol, provide standards for audio, video, and data communications across packet-based networks, including the Internet. *H.323: The Multimedia Communications Standard for Local Area Networks, IEEE Communications Magazine,* Vol. 34, No. 12, 1996, pp. 52–56. By complying with these standards, multimedia products and applications can interoperate, allowing users to communicate without concern for compatibility. These communication protocols also establish a variety of standards for digitizing and compressing speech, which reflect tradeoffs between speech quality, bit rate, computer power, and signal delay. For example, H.323 compliant devices uses the support of a G.723 coder/decoder (codec) for speech compression that is designed to transmit audio data at low speeds such as 56 kbps.

Figure 1:
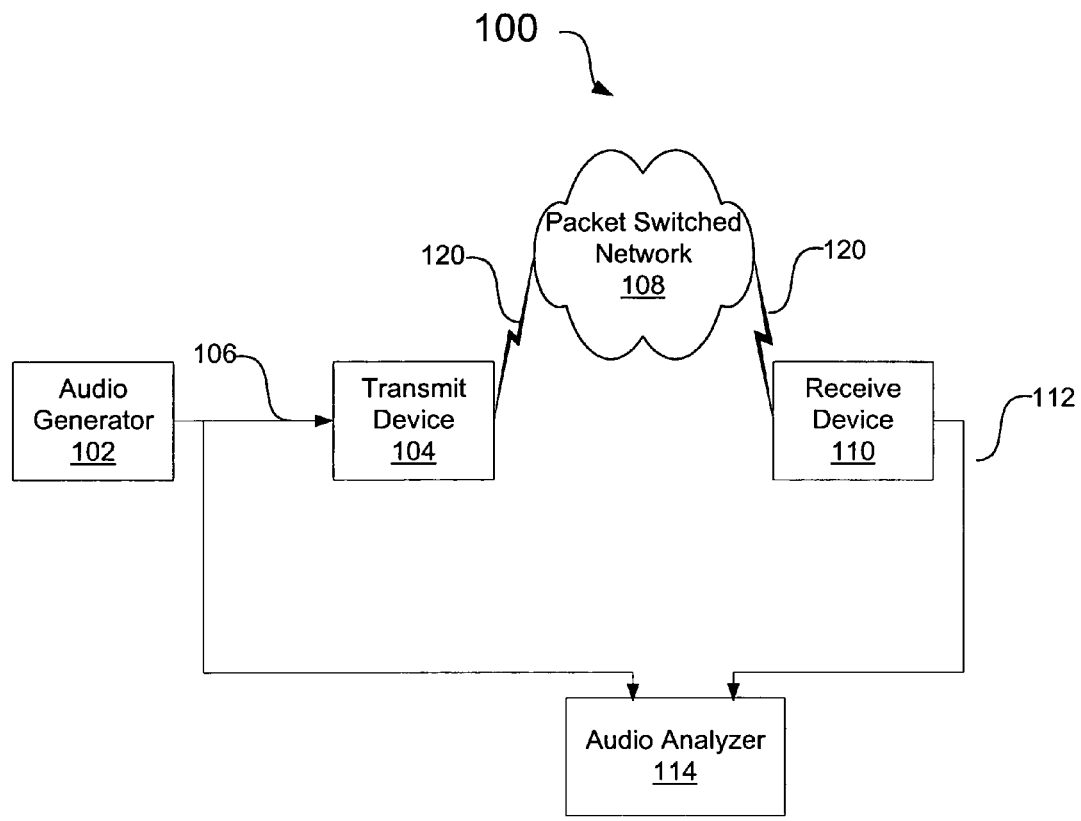
FIG. 1 is a block diagram of a test system.

FIG. 1 is a block diagram illustrating an audio test environment 100 for analyzing and quantifying audio data losses that occur during telephony calls over a packet-switched network 108 such as the Internet. Test environment 100 can be used to analyze a variety of audio transmission qualities, such as latency, audio data loss and frequency response, that are experienced during telephony calls between packet-based telephony equipment such as computers, Internet telephones, and even radio-frequency (RF) communication devices.

Transmit device 104 and receive device 110 are telephony-enabled devices, such as computers, hand-held personal digital assistants (PDA's) and Internet telephones, that are capable of supporting a telephony communication session over network 108. In one implementation, transmit devices 104 and receive devices 110 are general-purpose computers acting as hosts for telephony software and hardware to be tested. Network 108 represents any packet-switched network, such as the Internet, and communicatively couples transmit device 104 and receive device 110. Transmit device 104 and receive device 110 may be connected to network 108 by a variety of means such as network cards, digital subscriber line (DSL) modems, cable modems, and conventional modems accessing network 108 via Internet Services Providers.

Transmit device 104 communicates audio data packets 120 to receive device 110 via network 108. Transmit device 104 includes a codec (not shown) for compressing the digitized input audio signal 106 for data packet transmission data. Receive device 110 receives audio data packets 120 from network 108, decompresses the compressed audio data using an internal codec (not shown) and converts the audio data packets 120 into output audio signal 112, which can be used to drive a handset or a speaker (not shown).

The codecs of transmit device 104 and receive device 110 can be implemented in software, hardware, or a combination thereof, and buffer audio data packets 120 for a fixed time duration, referred to herein as the buffer length. The buffer length is a function of the type of codec. For example, the G.723 codec defines an audio buffer length of 30 ms. Other conventional codecs include the G.711 and G.729, which have buffer durations of 120 msec and 10 msec, respectively.

Audio generator 102 represents any device suitable for producing input audio signal 106. For example, in one configuration audio generator 102 is a computer system having a high-quality audio card and an audio editor software program, such as the Cool Edit™ from Syntrillium Software™, suitable for modifying current audio files and creating custom audio files that are digital representations of analog audio signals having specific characteristics. Using the audio editor, a user can generate and modify audio files, such as adding a trigger signal.

In one implementation, three different types of wave files are used for testing transmit device 104 and receive device 110: continuous, alternating, and "pink noise." A continuous wave file uses a single audio channel to stream audio to transmit device 104. An alternating wave file uses a dual audio channel to stream audio signals and is useful to test whether receive device 110 correctly detects silence on a given channel. Pink noise wave files are used to measure the frequency response of the codecs within transmit device 104 and receive device 110 and consist of white noise that has been modified with a pinking filter. The pinking filter is used to create noise that has equal energy per octave.

Audio generator 102 adds a triggering signal to the wave files such that an audio analyzer 114 can synchronize input audio signal 106 with output audio signal 112. For example, a 0 dB amplitude, 10 cycle 220 Hz sine wave signal is used for triggering audio analyzer 114 during latency and data loss measurements.

In one implementation, audio generator 102 includes a speaker (not shown) to produce audible sound as a function of the generated audio signal. A microphone proximate to the speaker converts the sound generated by the speaker into input audio signal 106. In another implementation, audio generator provides the generated audio signal directly to an input jack of a sound card within transmit device 104.

Audio analyzer 114 captures input audio signal 106 and output audio signal 112 and helps users objectively determine whether audio data packets 120 experienced any data loss. More specifically, audio analyzer 114 compares the captured audio data signals 106 and 112 in order to quantify the received audio performance quality between two telephony end points, i.e., transmit device 104 and receive device 110.

Figure 2:
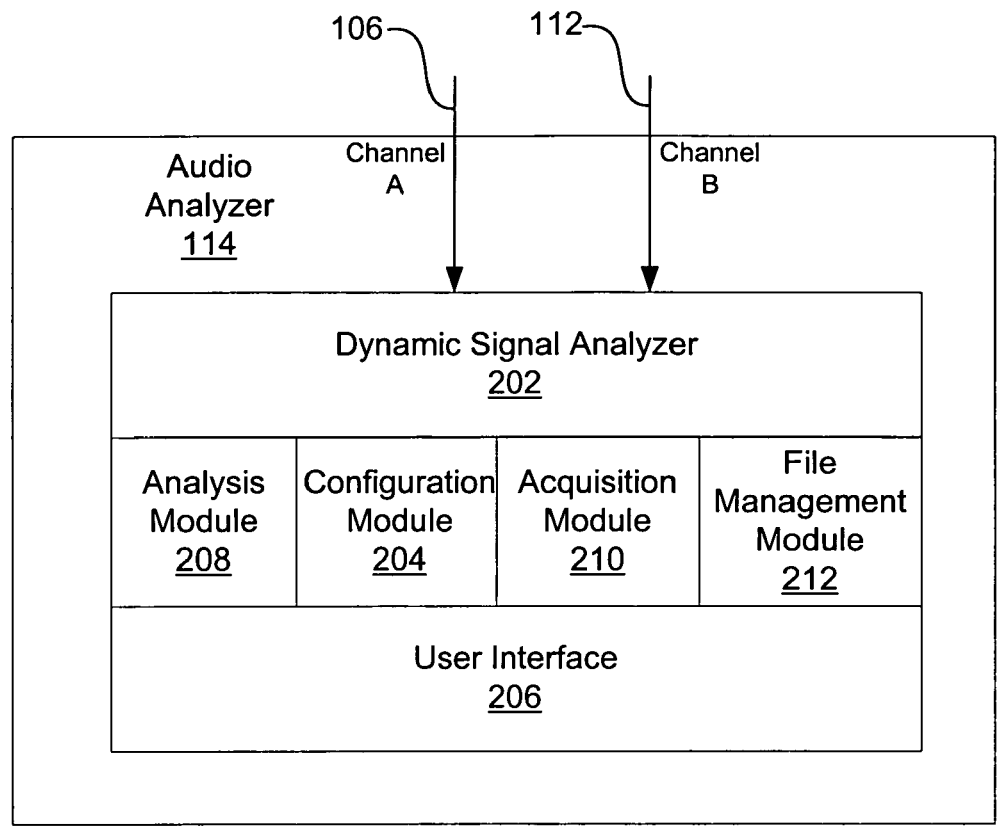
FIG. 2 is a block diagram of an audio analyzer.

FIG. 2 is a block diagram illustrating one embodiment of audio analyzer 114. Audio analyzer 114 is a computer system having a multi-channel dynamic signal analyzer (DSA) 202 and audio test software including configuration module 204, user interface 206, analysis module 208, acquisition module 210 and file management module 212.

DSA 202 is a computer-based Fast Fourier Transform (FFT) dynamic signal analyzer, such as the NI 4551 PCI Dynamic Signal Analyzer from National Instruments™, that delivers fast spectrum analysis, network analysis, and transient event analysis of sampled time-domain waveforms. DSA 202 can acquire time-varying signals and compute the frequency spectrum of the signals using Fourier analysis. DSA 202 has two inputs, channel A and channel B, that are used to receive and monitor input audio signal 106 and output audio signal 112, respectively.

User interface 206 provides a graphical interface by which a user can control configuration module 204, analysis module 208, acquisition module 210 and file management module 212. In addition, user interface 206 displays in real-time the data generated by the different analysis functions of analysis module 208. User interface 206 generates a variety of data plots and numerical displays for assessing various transmission qualities of audio data packets 120 such as data loss, latency and frequency response.

Configuration module 204 allows the user to configure acquisition module 210 and analysis module 208 in real-time while capturing and displaying the acquired data. In addition, configuration module controls various display settings within user interface 206. Configuration module 204 stores the settings such that the user can quickly configure audio analyzer 114 in response to different acquisition scenarios.

Acquisition module 210 allows the user to start and stop data acquisition, initialize DSA 202 and configure DSA 202 for appropriate triggering such that the input audio signal 106 and output audio signal 112 can be synchronized. Acquisition module 210 also monitors DSA 202 and handles any errors generated during acquisition.

Data analysis module 208 analyzes in real-time the data acquired by DSA 202 and converts the acquired data to graphic and numeric representation for plotting by user interface 206. As explained in detail below, data analysis module 208 supports analysis of a variety of transmission qualities including latency, data loss, frequency response, and volume verification.

File management module 212 allows the user to save data for exporting or future viewing. For example, file management module 212 allows the user to save plotted data points in ASCII file format with tab delimiters. The user can open a previously saved plot file for a static re-plot of the data and can save text data, such as the latency and data loss, to perform off-line analysis. Also, the user can save and restore the configuration settings to support repeatable acquisition processes.

Figure 3:
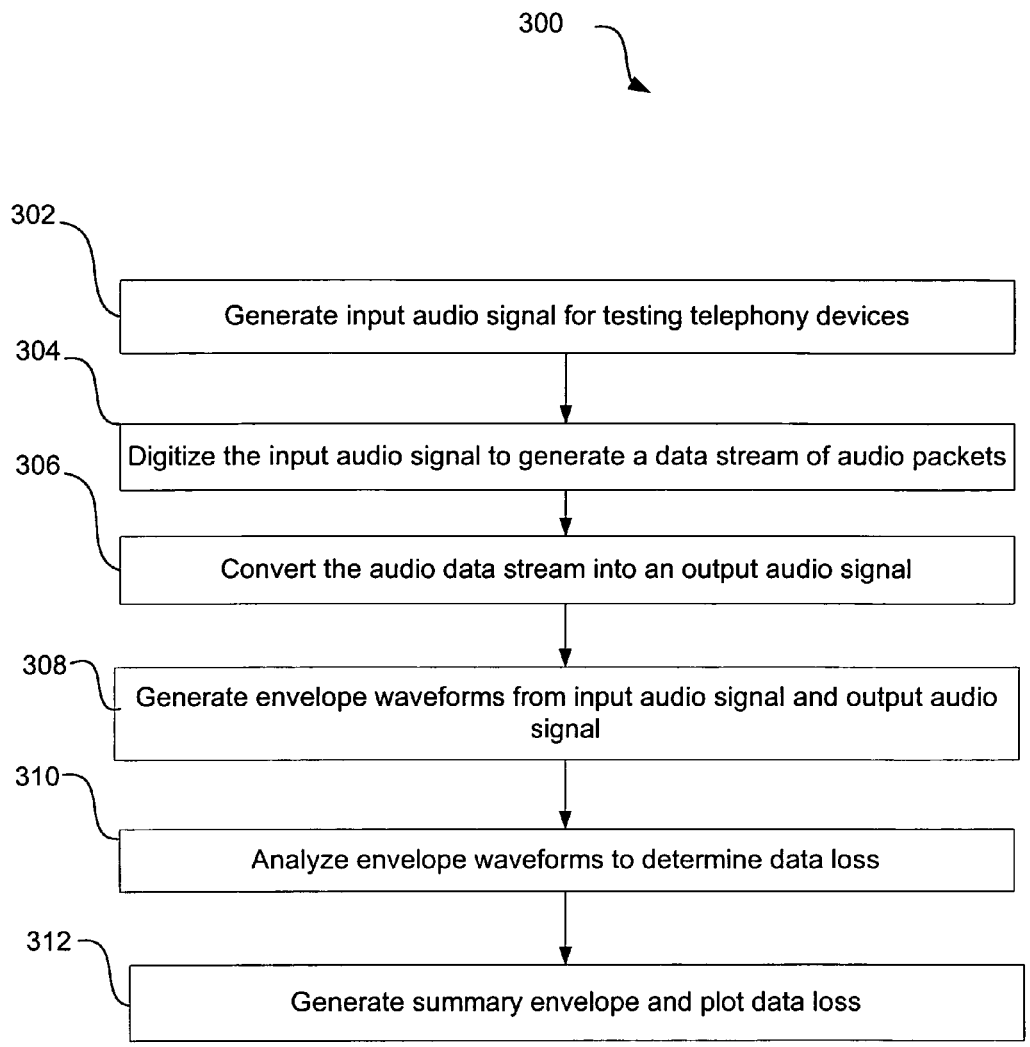
FIG. 3 is a flow chart illustrating one embodiment of a process in which the audio analyzer quantifies the audio transmission qualities of network-based telephony applications.

Audio analyzer 114 can be implemented in a computer, or a dedicated analysis tool, comprising digital electronic circuitry, computer hardware, firmware, software, or a combination of them. In addition, the testing process of the invention can be implemented in a machine-readable article storing instructions for execution by a programmable processor. FIG. 3 is a flow chart illustrating one embodiment of a process, suitable for implementation in a computer program, in which audio analyzer 114 of test environment 100 analyzes and quantifies the audio transmission qualities of telephony applications hosted by transmit device 104 and receive device 110.

Initially, audio generator 102 processes a stored audio file and drives transmit device 104 within input audio signal 106 (302). Transmit device 104 digitizes input audio signal 106 and generates compressed audio data packets 120 (304). Transmit device 104 communicates audio data packets 120 over network 108 to receive device 110 as a stream of data packets. Receive device 110 converts the audio data packets of data stream 120 to analog form and produces output audio signal 112 (306).

Audio analyzer 114 captures input audio signal 106 and output audio signal 112 and generates a corresponding peak-based envelope waveform for each captured audio signal (308). Each envelope waveform has a resolution that is a function of an audio buffer size determined by the particular codecs used by the devices under test. For example, in one embodiment, the resolution is set to 25 percent of the audio buffer size. For G.723, audio buffers are 30 ms in duration so the resulting envelope resolution is set for 7.5 ms. Other conventional codecs such as the G.711 and G.729 have a buffer duration of 120 ms and 10 ms, respectively. The resolution for these buffers would be 30 ms and 2.5 ms, respectively. The enveloping process improves the analysis process of identifying the true data loss by filtering out faulty data losses.

After generating the envelopes, audio analyzer 114 analyzes the envelope waveforms to determine audio transmission qualities, such as data loss and latency, of telephony applications and hardware hosted by transmit device 104 and receive device 110 (310). For example, analysis module 208 of audio analyzer 114 calculates the audio latency between transmit device 104 and receive device 110 by measuring the latency between the triggering signals present within input audio signal 106 and output audio signal 112. An additional feature includes, frequency response analysis for transmit device 104 and receive device 110. And, in order to verify the volume of the transmission, audio analyzer 114 calculates and displays a voltage magnitude for each envelope.

Audio analyzer 114 summarizes the envelopes by subtracting the output envelope data from the input envelope data to indicate lost data envelopes (312). The summary envelope waveform is voltage scaled to filter out the undesirable envelopes due to misalignment and any phase differences between waveforms. In one implementation, the resolution of the envelope is set to 25% of the buffer size of the codecs of transmit device 104 and receive device 110 such that four consecutive data points within the summary envelope waveform indicate a loss of an audio buffer and a data packet within data stream 120.

In generating the summary envelope, audio analyzer 114 calculates each data point, $Sum_{env}$, of the summary envelope according to the following equations:

$$Sum_{env} = \frac{(I_{env} - (O_{env} + O_{env} * C))}{(I_{env} + (O_{env} + O_{env} * C))} \text{ if } (Sum_{env} < .5 * C) \text{ then } Sum_{env} = 0$$

Where $I_{env}$ is the corresponding data point within the envelope waveform for the input audio signal 106, $O_{env}$ is the corresponding data point within the envelope waveform for the output audio signal 112, and C is a compensation factor calculated from any difference in voltages between the audio signals. After calculating a data point for the envelope summary waveform according to the above equation, audio analyzer plots the envelope summary waveform to indicate any lost data packets.

Figure 4:
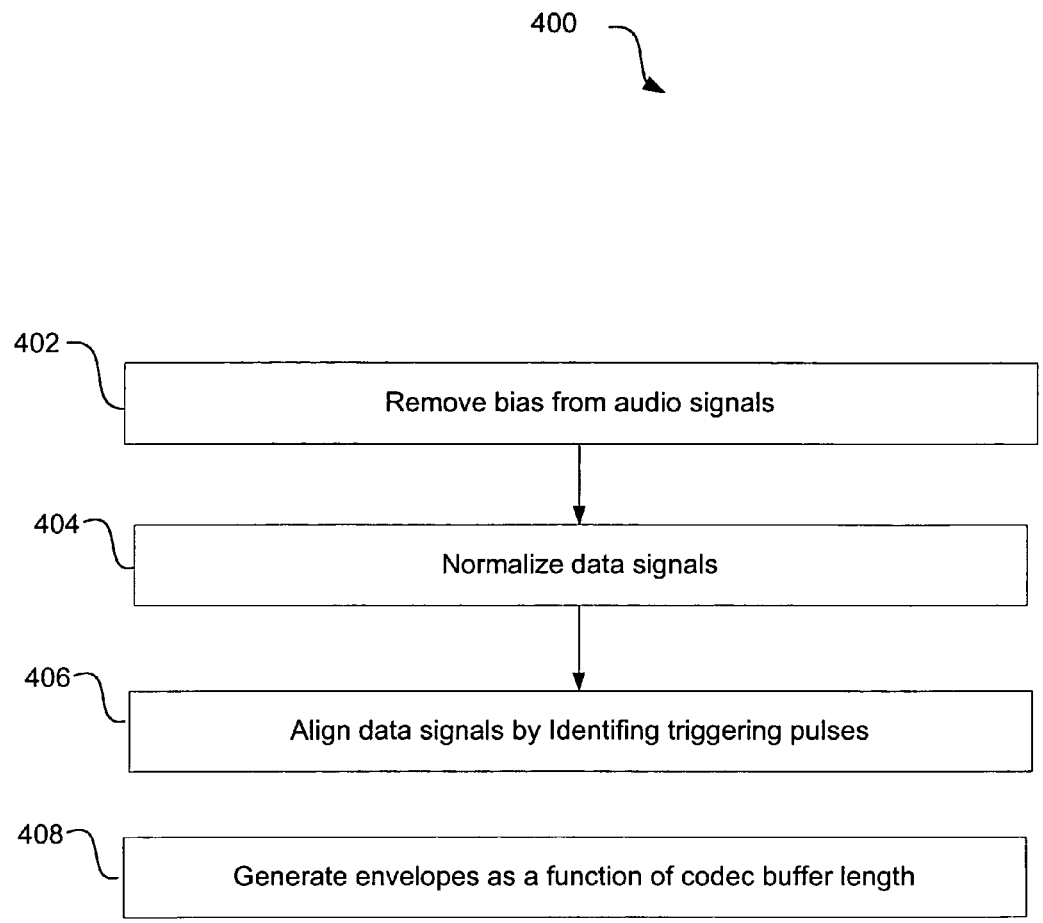
FIG. 4 is a flow chart illustrating one embodiment of a process in which the audio analyzer generates peak-based envelope waveforms.

FIG. 4 is a flow chart illustrating a process 400 by which audio analyzer 114 generates peak-based envelope waveforms from the captured input audio signal 106 and output audio signal 112. First, audio analyzer 114 analyzes data captured by DSA 202 and determines whether any amplitude bias is present within input audio signal 106 before the audio signal is transmitted by transmit device 104. If so, audio analyzer 114 removes the amplitude bias from both input audio signal 106 and output audio signal 112 (402). Next, audio analyzer 114 normalizes the data generated by DSA 202 in capturing the audio signals (404). More specifically, audio analyzer 114 converts the raw data for captured input and output audio signals 106 and 112 to positive values.

After normalizing the signals, audio analyzer 114 aligns the captured audio signals to compensate for expected latency introduced during transmission (406). As described above, each audio signal includes a trigger signal, such as a short, low frequency, high-energy burst to support the alignment. Audio analyzer 114 uses the trigger signal to synchronize the capture of the transmitted and received audio signals 106 and 112 and to support the alignment process for loss analysis. Audio analyzer scans the captured data to identify the pulses of the embedded trigger signals, thereby determining starting positions for generating the envelope waveforms.

Next, audio analyzer 114 proceeds from the starting positions within the captured data and generates the enveloping waveforms as a function of the codec buffer length used by the codec's in transmit device 104 and receive device 110.

Figure 5:
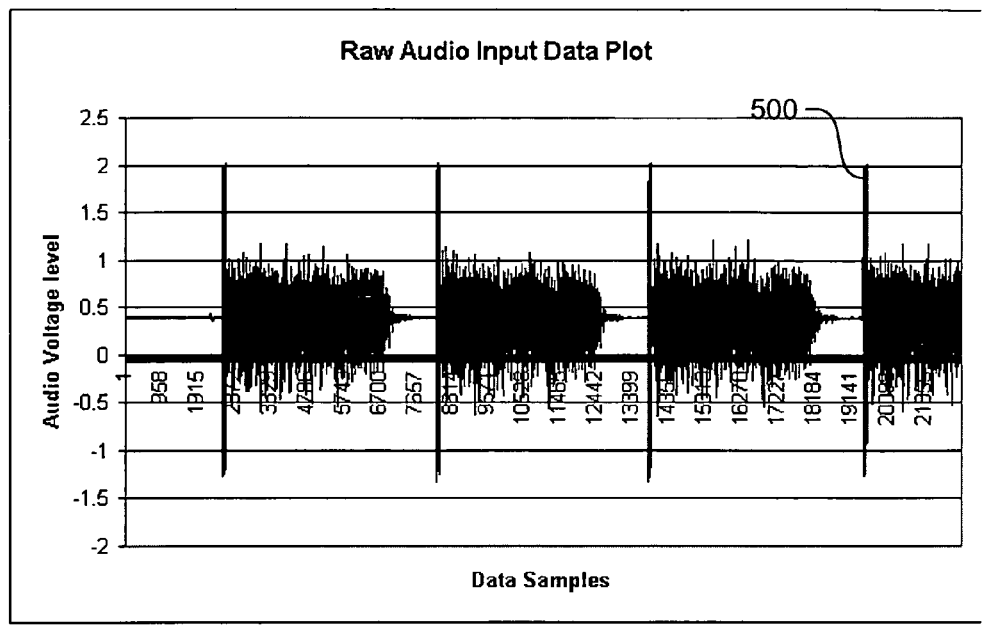
FIGS. 5 and 6 are plots of an input audio signal and an output audio signal, respectively.
Figure 6:
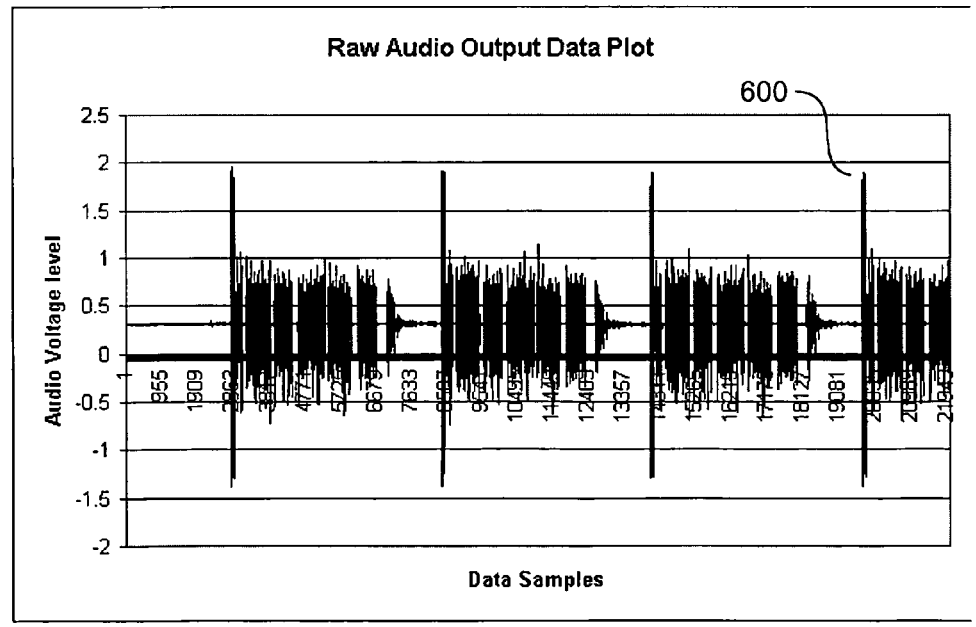
Figure 7:
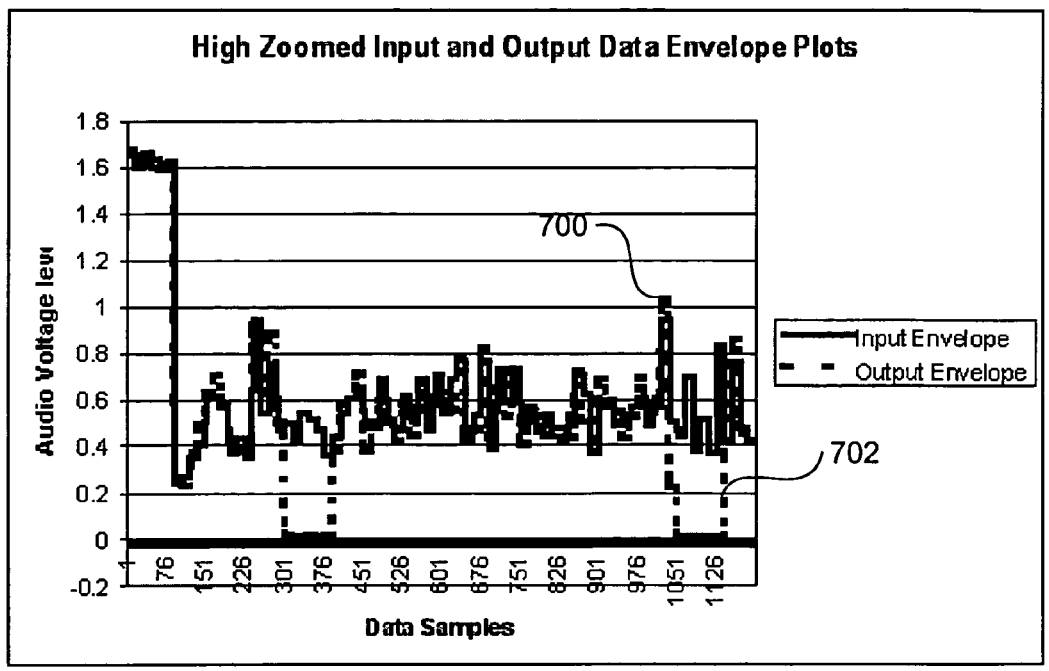
FIG. 7 is a plot illustrating envelope waveforms generated from the input audio signal and the output audio signal.
Figure 8:
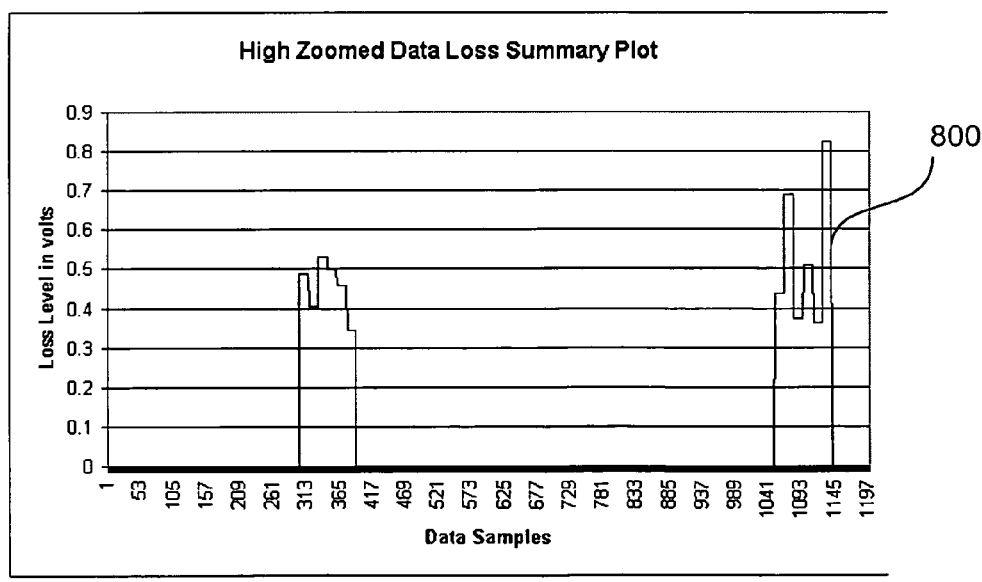
FIG. 8 is a plot illustrating a summary data loss waveform.

FIG. 5 is a plot illustrating an example input audio signal 500 produced by audio generator 102 and provided to transmitting device 104 for communication to receive device 110. Similarly, FIG. 6 is a plot illustrating an example output audio signal 600 generated by receive device 110 from audio data packets 120. FIG. 7 is a plot illustrating an example input envelope waveform 700 and an example output envelope waveform 702 generated by audio analyzer 114 from the input audio signal 500 and output audio signals 600. FIG. 8 illustrates a summary data loss envelope 800 generated from input envelope waveform 700 and output envelope waveform 702.

The invention has been described in reference to a variety of embodiments. Other embodiments are within the scope of the following claims.

What is claimed is:

1. A method comprising:
  generating audio packets representing an input audio signal;
  communicating the audio packets over a network;
  generating an output audio signal from the communicated audio packets;
  generating an input envelope waveform and an output envelope waveform from the input audio signal and the output audio signal, respectively, the input envelope waveform defining an input voltage magnitude and the output envelope waveform defining an output voltage magnitude;
  generating a summary envelope waveform by aligning the input envelope waveform and the output envelope waveform and calculating data points by comparing the input and output envelope waveforms; and
  plotting the summary envelope to indicate lost audio packets.

2. The method of claim 1, wherein comparing the envelope waveforms includes subtracting the output envelope waveform from the input envelope waveform.

3. The method of claim 1, wherein comparing the envelope waveforms includes determining a transmission quality including at least one of data loss and latency.

4. The method of claim 1, wherein communicating the audio packets includes communicating the audio packets over the Internet.

5. The method of claim 1, wherein communicating the audio packets includes communicating the audio packets between telephony-enabled computers.

6. The method of claim 1, wherein generating the audio packets includes generating the audio packets from an Internet telephone.

7. The method of claim 1, wherein:
  generating the audio packets includes digitizing the input audio signal and compressing the digitized input audio signal using an input coder/decoder (codec) having a first buffer length,
  generating the output audio signal includes generating the output audio signal using an output coder/decoder (codec) having a second buffer length, and
  generating the envelope waveforms includes generating the envelope waveforms at a resolution that is a function of the first buffer length and the second buffer length.

8. A method comprising:
  capturing an input audio signal and an output audio signal associated with a network based telephony communication;
  generating an input envelope waveform and an output envelope waveform from the input audio signal and the output audio signal, respectively, the input envelope waveform defining an input voltage magnitude and the output envelope waveform defining an output voltage magnitude;
  generating a summary envelope waveform by aligning the input envelope waveform and the output envelope waveform and calculating data points by subtracting the output envelope waveform from the input envelope waveform; and
  plotting the summary envelope to indicate lost audio packets.

9. The method of claim 8, wherein generating the input and output envelope waveforms includes removing a bias.

10. The method of claim 8, wherein generating the input and output envelope waveforms includes normalizing the captured input and output audio signals.

11. The method of claim 8, wherein capturing the input and output audio signals includes triggering the capture using a trigger signal embedded within the input audio signal.

12. The method of claim 8, wherein generating the input and output envelope waveforms includes aligning the captured input and output audio signals.

13. The method of claim 8, wherein the output audio signal comprises an analog signal generated from an audio data stream of digital packets communicated over a packet-based network, and further wherein the digital data stream is generated from the input audio signal.

14. The method of claim 13, wherein generating the input and output envelope waveforms includes generating the envelope waveforms at a resolution that is a function of a buffer length of coder/decoders (codecs) used in generating the audio data stream and the output audio signal.

15. An article comprising a computer-readable medium having computer-executable instructions stored thereon for causing a computer to:
   capture an input audio signal and an output audio signal associated with a network based telephony communication;
   generate an input envelope waveform and an output envelope waveform from the input audio signal and the output audio signal, respectively, the input envelope waveform defining an input voltage magnitude and the output envelope waveform defining an output voltage magnitude;
   generate a summary envelope waveform by aligning the input envelope waveform and the output envelope waveform and calculating data points by subtracting the output envelope waveform from the input envelope waveform; and
   plot the summary envelope to indicate lost audio packets.

16. The article of claim 15, wherein the computer-executable instructions cause the computer to generate the input and output envelope waveforms by removing any amplitude bias in the captured signals, normalizing the captured signals, and aligning the captured signals using a trigger signal embedded within the input audio signal.

17. The article of claim 15, wherein the output audio signal is an analog signal generated from an audio data stream of digital packets communicated over a packet-based network, and further wherein the digital data stream is generated from the input audio signal.

18. The article of claim 17, wherein the computer-executable instructions cause the computer to generate the envelope waveforms at a resolution that is a function of a buffer length of coder/decoders (codecs) used in generating the audio data stream and the output audio signal.

19. A system comprising:
   a transmit device to convert an input audio signal to data packets;
   a receive device communicatively coupled to the transmit device via a packet switched network, wherein the receive device receives the data stream and converts the data stream to an output audio signal; and
   an audio analyzer coupled to the transmit device and the receive device, wherein the audio analyzer captures the input audio signal and the output audio signal, and further wherein the audio analyzer generates an input envelope waveform defining an input voltage magnitude, an output envelope waveform defining an output voltage magnitude, and a data loss summary envelope by aligning the input envelope waveform and the output envelope waveform and calculating data points by comparing the input and output envelope waveforms and further wherein the audio analyzer plots the data loss summary envelope to indicate lost audio packets.

20. The system of claim 19, wherein the transmit device includes a coder/decoder (codec) to convert the input audio signal to digital data and the receive device includes a coder/decoder (codec) to convert the digital data stream to the output audio signal, and further wherein the summary envelope has a resolution that is as a function of a buffer length of the codec of the transmit device and a buffer length for the codec of the receive device.

21. The system of claim 20, wherein the codecs have equal buffer lengths and the resolution of the envelope waveforms is approximately 25% of the codec buffer length.

22. The system of claim 20, wherein the codecs are G.723 codecs and the transmit device communicates the data stream using the H.323 protocol, and further wherein the buffer length is approximately 30 ms and the resolution of the envelope waveforms is approximately 7.5 ms.

23. The system of claim 19, wherein the network is a global computer network.

24. The system of claim 19, wherein the transmitting device or the receiving device comprises an telephony-enabled computer.

25. The system of claim 19, wherein the transmitting device or the receiving device comprises an Internet telephone.

26. The system of claim 19, wherein the audio analyzer further includes means for subtracting the output audio signal from the input audio signal to generate the summary data loss envelope.

27. The system of claim 19, wherein the audio analyzer includes a graphical user interface that displays in real-time the summary envelope waveform and transmission qualities within the audio test system including latency.

28. The system of claim 19, wherein the audio analyzer includes a multi-channel dynamic signal analyzer for sampling the input audio signal and the output audio signal.

29. The system of claim 19 and further including an audio generator to generate the input audio signal from a stored audio file.

30. The system of claim 19, wherein the input audio signal includes a trigger signal having a low-frequency, high amplitude pulse.

* * * * *

UNITED STATES PATENT AND TRADEMARK OFFICE
CERTIFICATE OF CORRECTION

| | |
|---|---|
| PATENT NO. | : 6,996,068 B1 |
| APPLICATION NO. | : 09/541046 |
| DATED | : February 7, 2006 |
| INVENTOR(S) | : Sherlock |

Page 1 of 1

It is certified that error appears in the above-identified patent and that said Letters Patent is hereby corrected as shown below:

In column 8, line 4, in Claim 19, after "waveforms" insert -- , --.

In column 8, line 26, in Claim 24, after "comprises" delete "an" and insert -- a --, therefor.

Signed and Sealed this

Second Day of October, 2007

JON W. DUDAS
*Director of the United States Patent and Trademark Office*